United States Patent
Chiang et al.

(10) Patent No.: US 9,478,960 B2
(45) Date of Patent: Oct. 25, 2016

(54) MOUNTING PLATE AND SECURITY DEVICE USING THE SAME

(71) Applicant: Sercomm Corporation, Taipei (TW)

(72) Inventors: Chin-Chang Chiang, Taipei (TW); Chin-Liang Wang, Taipei (TW)

(73) Assignee: SERCOMM CORPORATION, Taipei (TW)

(*) Notice: Subject to any disclaimer, the term of this patent is extended or adjusted under 35 U.S.C. 154(b) by 64 days.

(21) Appl. No.: 14/540,138

(22) Filed: Nov. 13, 2014

(65) Prior Publication Data
US 2015/0138747 A1    May 21, 2015

(30) Foreign Application Priority Data

Nov. 15, 2013    (CN) ...................... 2013 2 0729069 U

(51) Int. Cl.
| | |
|---|---|
| H05K 7/02 | (2006.01) |
| H02G 3/30 | (2006.01) |
| H05K 3/34 | (2006.01) |
| H05K 5/00 | (2006.01) |
| H05K 5/02 | (2006.01) |
| H02G 3/10 | (2006.01) |

(52) U.S. Cl.
CPC ............... *H02G 3/30* (2013.01); *H05K 5/0204* (2013.01); *H05K 7/02* (2013.01); *H02G 3/10* (2013.01); *H05K 3/3447* (2013.01); *H05K 5/0017* (2013.01); *H05K 5/0247* (2013.01); *H05K 2201/10386* (2013.01); *H05K 2201/10393* (2013.01); *H05K 2201/10863* (2013.01)

(58) Field of Classification Search
CPC ..... H05K 5/0017; H05K 3/3447; H05K 7/02; H05K 2201/10386; H05K 2201/10393; H05K 2201/10863; H05K 3/306; H05K 5/0247; H05K 3/10; H05K 5/0204; F24F 13/20; H02G 3/30
USPC ........... 174/58, 481, 489, 502, 503, 561, 562; 361/679.02, 679.58, 801, 802, 803, 361/807, 809; 439/80, 81, 82, 260, 370, 439/377, 549, 552, 575, 544
See application file for complete search history.

(56) References Cited

U.S. PATENT DOCUMENTS

| | | | | |
|---|---|---|---|---|
| 5,574,612 A | * | 11/1996 | Pak ....................... | H01R 9/2491 361/115 |
| 6,089,880 A | * | 7/2000 | Miyagawa ............. | H01R 13/11 439/741 |
| 2010/0101854 A1 | * | 4/2010 | Wallaert ................. | F24F 11/00 174/502 |
| 2013/0175905 A1 | * | 7/2013 | Sanlaville ........... | B60R 11/0205 312/7.1 |

* cited by examiner

*Primary Examiner* — James Wu
(74) *Attorney, Agent, or Firm* — McClure, Qualey & Rodack, LLP

(57) ABSTRACT

A mounting plate and a security device using the same are provided. The mounting plate is for being fixed to a surface, wherein a mounting device is hanged up on the mounting plate, and the mounting plate comprises a first conductive sheet and a second conductive sheet electrically connected to a first electrode of an exterior power and a second electrode of the exterior power respectively. When the mounting device is hanged up on the mounting plate, the exterior power is electrically connected to the mounting device through the first conductive sheet and the second conductive sheet.

8 Claims, 6 Drawing Sheets

MOUNTING PLATE AND SECURITY DEVICE USING THE SAME

This application claims the benefit of People's Republic of China application Serial No. 201320729069.9, filed on Nov. 15, 2013, the subject matter of which is incorporated herein by reference.

BACKGROUND

1. Field of the Disclosure

The disclosure relates in general to a mounting plate and a security device using the same, and more particularly to a mounting plate having a conductive sheet and a security device using the same.

2. Description of the Related Art

A security device may include a main body and a mounting plate. The main body is mounted on the mounting plate after the mounting plate is fixed on a wall surface. Then, a power plug is engaged with an anti-drop structure after the power plug is inserted into a socket of the main body.

However, such design makes assembling of the security device complicated and increase the cost of the anti-drop structure.

SUMMARY

The disclosure is directed to a mounting plate and a security device using the same to resolve the above-mentioned and other problems.

According to one embodiment of the present disclosure, a mounting plate is provided. The mounting plate is for being fixed to a surface, wherein a mounting device is hanged up on the mounting plate, and the mounting plate comprises a first conductive sheet and a second conductive sheet electrically connected to a first electrode of an exterior power and a second electrode of the exterior power respectively. When the mounting device is hanged up on the mounting plate, the exterior power is electrically connected to the mounting device through the first conductive sheet and the second conductive sheet.

According to another embodiment of the present disclosure, a security device is provided. The security device comprises a mounting plate, a mounting device, a first conductive portion and a second conductive portion. The mounting plate is for being fixed to a surface, wherein the mounting device is hanged up on the mounting plate, and the mounting plate comprises a first conductive sheet and a second conductive sheet electrically connected to a first electrode of an exterior power and a second electrode of the exterior power respectively. When the mounting device is hanged up on the mounting plate, the exterior power is electrically connected to the mounting device through the first conductive sheet and the second conductive sheet. The first conductive portion is for contacting the first conductive sheet of the mounting device when the mounting device is hanged up on the mounting plate. The second conductive portion is for contacting the second conductive sheet of the mounting device when the mounting device is hanged up on the mounting plate.

The above and other aspects of the disclosure will become better understood with regard to the following detailed description of the preferred but non-limiting embodiment(s). The following description is made with reference to the accompanying drawings.

DETAILED DESCRIPTION

Figure 1:
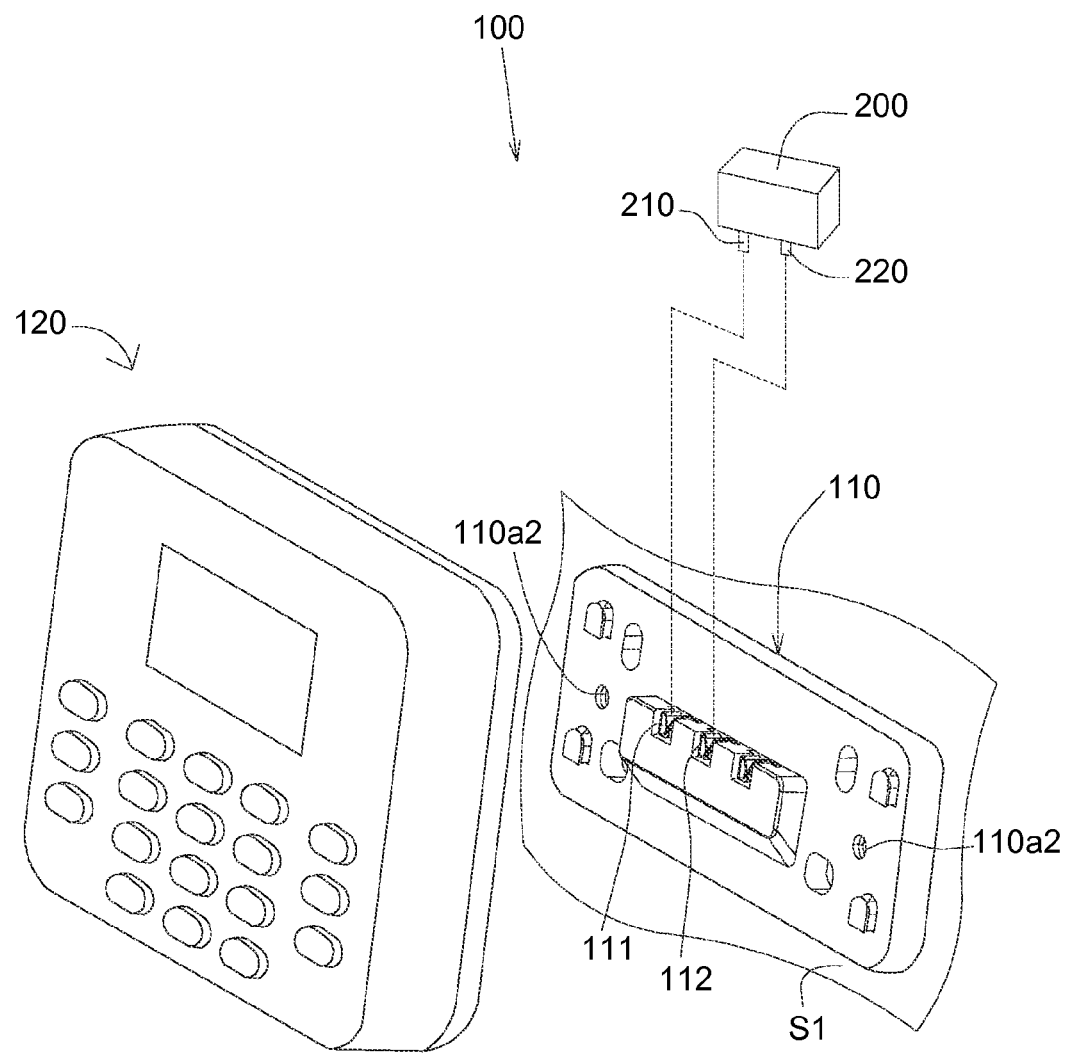
FIG. 1 illustrates a decomposition diagram of a security device according to an embodiment of the disclosure.

Referring to FIG. 1, a decomposition diagram of a security device according to an embodiment of the disclosure is illustrated. The security device 100 includes a mounting plate 110 and a mounting device 120. The mounting plate 110 may be fixed to a surface 51, such as a wall surface, wherein the mounting device 120 may be hanged up on the mounting plate 110.

The mounting plate 110 includes a first conductive sheet 111 and a second conductive sheet 112, wherein the first conductive sheet 111 and the second conductive sheet 112 are electrically connected to a first electrode 210 and a second electrode 220 of an exterior power source 200. When the mounting device 120 is hanged up on the mounting plate 110, the exterior power source 200 may provide the mounting device 120 with power through the first conductive sheet 111 and the second conductive sheet 112. In one embodiment, the exterior power source 200 may be an AC-DC converter.

Figure 2A:
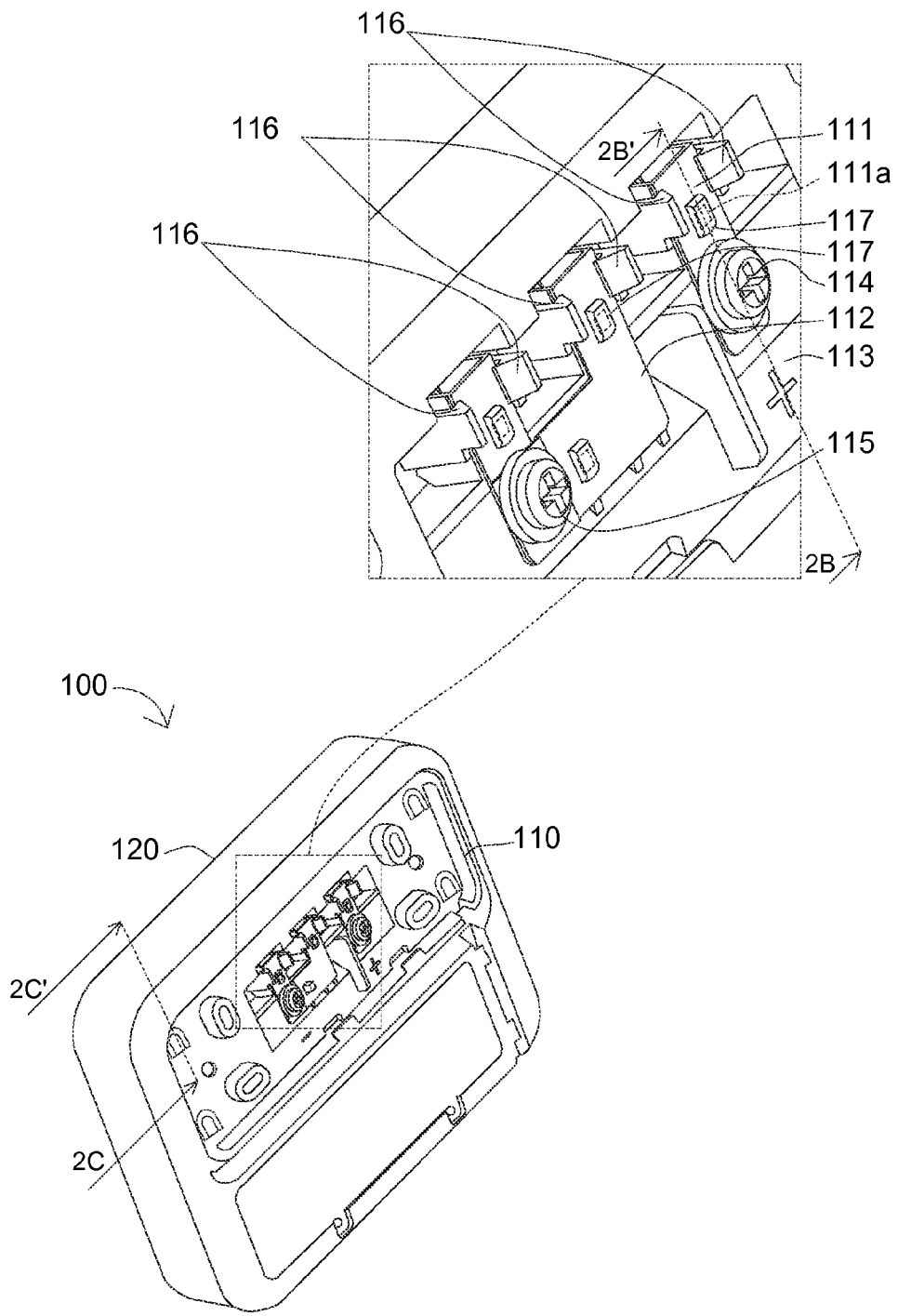
FIG. 2A illustrates a rear view of the security device according to an embodiment of the disclosure.

Referring to FIG. 2A, a rear view of the security device according to an embodiment of the disclosure is illustrated. The mounting plate 110 further includes a plate body 113, a first locking element 114 and a second locking element 115. The first conductive sheet 111 and the second conductive sheet 112 are fixed to the plate body 113 through the first locking element 114 and the second locking element 115 respectively.

As illustrated in FIG. 2A, the mounting plate 110 further includes a plurality of hook pairs 116 disposed on the plate body 113. Furthermore, one of the hook pairs 116 is engaged with two opposite sides of the first conductive sheet 111, so as to prevent the first conductive sheet 111 from being easily detached from the plate body 113. In addition, another of the hook pairs 116 is engaged with two opposite sides of the second conductive sheet 112, so as to prevent the second conductive sheet 112 from being easily detached from the plate body 113.

The first conductive sheet 111 has a through hole 111a. The plate body 113 of the mounting plate 110 includes a fixing pillar 117, and the first conductive sheet 111 may be fixed to the plate body 113 through the fixing pillar 117. In addition, the second conductive sheet 112 may be fixed to the plate body 113 through another fixing pillar 117.

Figure 2B:
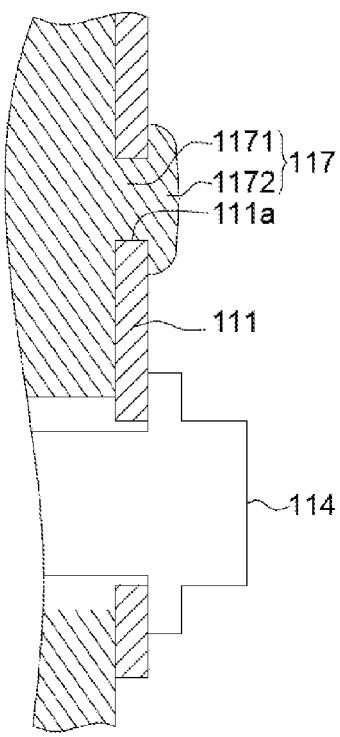
FIG. 2B illustrates a cross sectional view of the mounting plate of FIG. 2A along a direction 2B-2B'.

Referring to FIG. 2B, a cross sectional view of the mounting plate of FIG. 2A along a direction 2B-2B' is illustrated. The fixing pillar 117 includes a pillar body 1171 and a pressing head 1172 connecting to the pillar body 1171. The pillar body 1171 passes through the through hole 111a of the first conductive sheet 111, and the pressing head 1172 fixes the first conductive sheet 111 to the plate body 113 (as illustrated in FIG. 2A). The pressing head 1172 may be formed by way of hot pressing, such that an outer diameter of the compressed pressing head 1172 is larger than an inner diameter of the through hole 111 a. As a result the pressing head 1172 may prevent the first conductive sheet 111 from being detached from the plate body 113 (as illustrated in FIG. 2A).

Figure 2C:
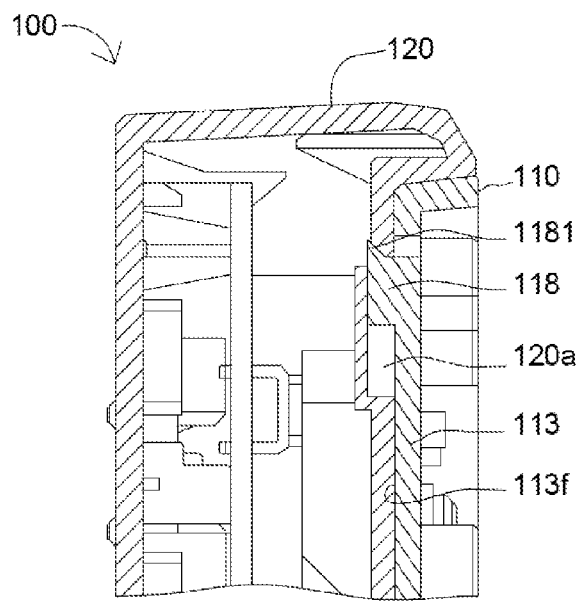
FIG. 2C illustrates a cross sectional view of the mounting plate of FIG. 2A along a direction 2C-2C'.

Referring to FIG. 2C, a cross sectional view of the mounting plate of FIG. 2A along a direction 2C-2C' is illustrated. The mounting plate 110 further includes a protrusion 118, and the plate body 113 has a front surface 113f, wherein the protrusion 118 is disposed on and projected from the front surface 113f. The protrusion 118 has a stop portion 1181 upwardly extended, and the mounting device 120 has a through hole 120a. When the mounting device 120 is hanged up on the mounting plate 110, the protrusion 118 passes through the through hole 120a of the mounting device 120. The stop portion 1181 is upwardly extended and restricts the movement of the mounting device 120, preventing the mounting device 120 from being detached from the mounting plate 110.

Figure 3:
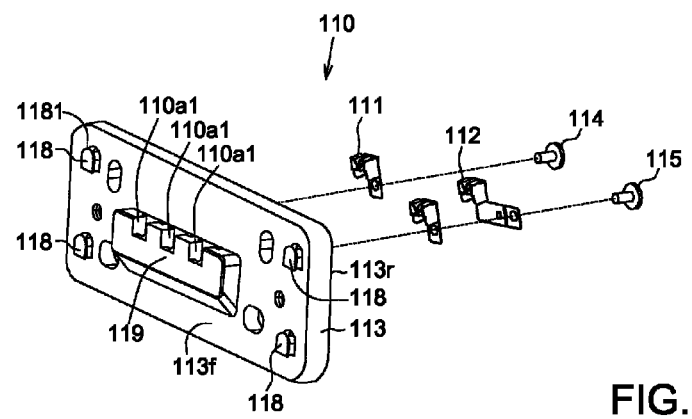
FIG. 3 illustrates a decomposition diagram of the mounting plate.

Referring to FIG. 3, a decomposition diagram of the mounting plate is illustrated. When the mounting device 120 is hanged up on several protrusions 118 of the mounting plate 110, the mounting device 120 is restricted by the protrusions 118 from being easily rotated with respect to the mounting plate 110. In the present embodiment, as an example, the number of the protrusions 118 is four, and the protrusions 118 are disposed adjacent to four corners of the plate body 113.

As illustrated in FIG. 3, the mounting plate 110 further includes an island 119 and a plurality of through holes 110a1. The island 119 is projected from the front surface 113f of the plate body 113. The through holes 110a1 pass through the island 119 and the plate body 113, such that the first conductive sheet 111 and the second conductive sheet 112 may pass through the through holes 110a1 from the rear surface 113r of the plate body 113 and be exposed from the island 119 (as illustrated in FIG. 1). As a result, a first conductive portion 125 and a second conductive portion 126 (both are illustrated in FIG. 4) of the mounting device 120 may contact the exposed first conductive sheet 111 and the second conductive sheet 112.

Figure 4:
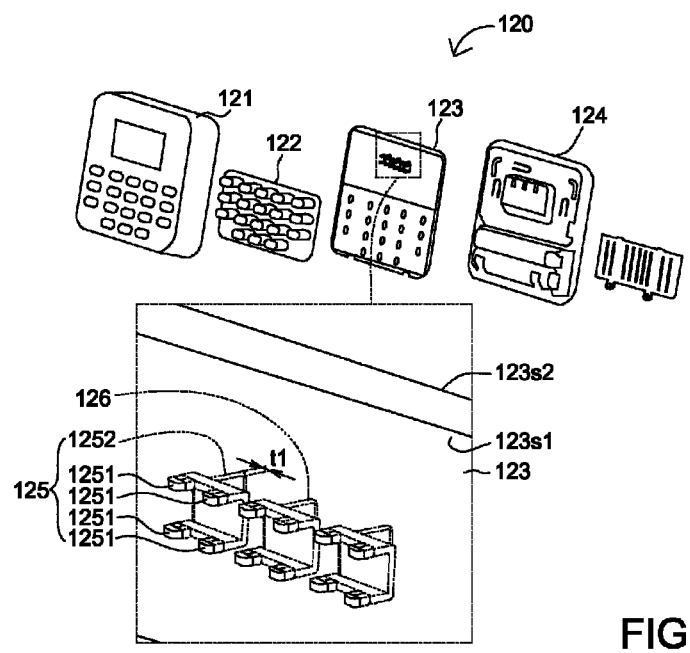
FIG. 4 illustrates a decomposition diagram of the mounting device of FIG. 1.

Referring to FIG. 4, a decomposition diagram of the mounting device of FIG. 1 is illustrated. The mounting device 120 includes a front cover 121, an operation board 122, a circuit board 123, a rear cover 124, the first conductive portion 125 and the second conductive portion 126. The operation board 122 and the circuit board 123 are disposed between the front cover 121 and the rear cover 124, such that the operation board 122 and the circuit board 123 are protected by the front cover 121 and the rear cover 124.

As illustrated in FIG. 4, the first conductive portion 125 and the second conductive portion 126 are inserted into the circuit board 123. The first conductive portion 12 includes a plurality of pins 1251 and an insert 1252, wherein the pins 1251 pass through the circuit board 123 and are exposed on a first surface 123s1 of the circuit board 123, and the insert 1252 is exposed on a second surface 123s2 of the circuit board 123 to contact the first conductive sheet 111 (as illustrated in FIG. 1). The second conductive portion 126 has a structure similar to that of the first conductive portion 125, and the similarities are not repeated here.

Figure 5:
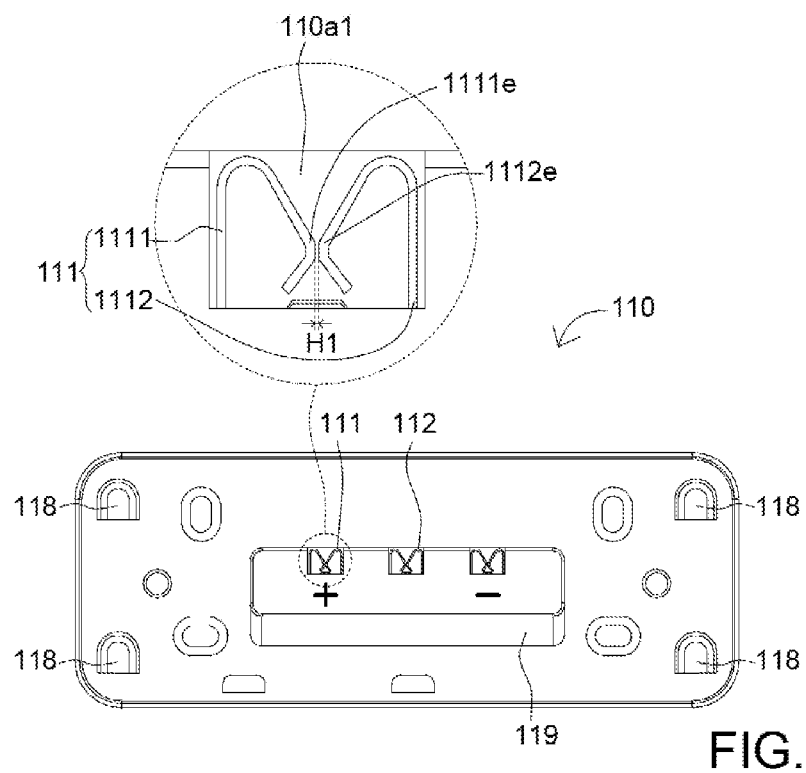
FIG. 5 illustrates a front view of the mounting plate of FIG. 1.
Figure 6:
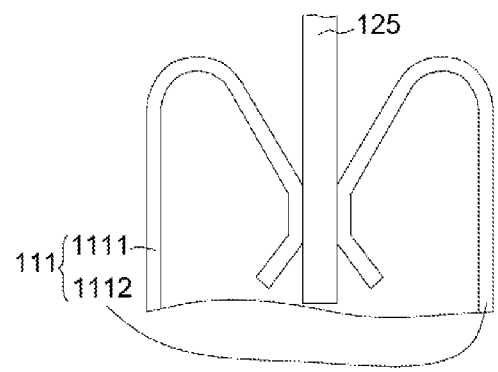
FIG. 6 illustrates a schematic diagram of the first conductive portion being inserted into the first conductive sheet of FIG. 5.

Referring to FIGS. 5 and 6, FIG. 5 illustrates a front view of the mounting plate of FIG. 1 and FIG. 6 illustrates a schematic diagram of the first conductive portion being inserted into the first conductive sheet of FIG. 5. The first conductive sheet 111 includes a first elastic clamp 1111 and a second elastic clamp 1112 disposed opposite to the first elastic clamp 1111. An end 1111e of the first elastic clamp 1111 is projected toward the second elastic clamp 1112, and an end 1112e of the second elastic clamp 1112 is projected toward the first elastic clamp 1111, such that a gap H1 between the end 1111e and the end 1112e may be very narrow or equal to zero. When the first conductive sheet 111 is at a free state, the gap H1 may be equal to or less than the thickness t1 (as illustrated in FIG. 4) of the first conductive portion 125. When the mounting device 120 (as illustrated in FIG. 1) is hanged up on the mounting plate 110, the first conductive portion 125 is inserted into the gap H1 of the first conductive sheet 111 (as illustrated in FIG. 6), such that the first elastic clamp 1111 and the second elastic clamp 1112 deform outwardly and inwardly apply elastic forces to the first conductive portion 125. As a result, the first conductive portion 125 is clamped within the first conductive sheet 111. In addition, the second conductive sheet 112 has a structure similar to that of the first conductive sheet 111, the second conductive portion 126 has a structure similar to that of the first conductive portion 125, and the similarities are not repeated here.

After the mounting device 120 is hanged up on the mounting plate 110, the first conductive portion 125 and the second conductive portion 126 of the mounting device 120 are inserted into the first conductive sheet 111 and the second conductive sheet 112 of the mounting plate 110, such that the exterior power source 200 (as illustrated in FIG. 1) may provide the mounting device 120 with power through the first conductive sheet 111, the second conductive sheet 112, the first conductive portion 125 and the second conductive portion 126. Thus, an additional power plug and an additional anti-drop structure are not required. As a result, an assembling working procedure for the security device 100 can be simplified and assembling time for the security device 100 can be reduced.

Figure 7:
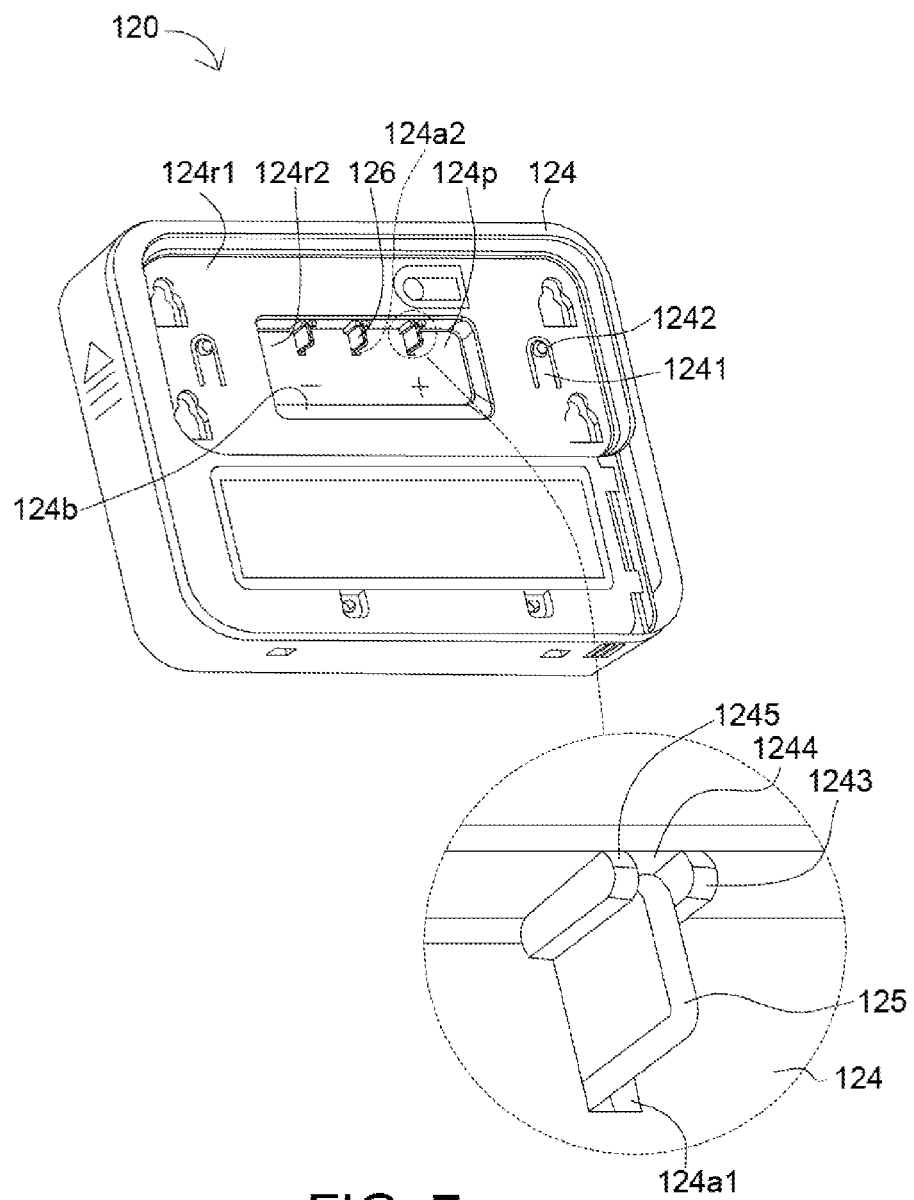
FIG. 7 illustrates a rear view of the mounting device of FIG. 1.

Referring to FIG. 7, a rear view of the mounting device of FIG. 1 is illustrated. The rear cover 124 of the mounting device 120 has a receiving recess 124p, a first through hole 124a1 and a second through hole 124a2. The receiving recess 124p is used for receiving the island 119 (as illustrated in FIG. 3). The first through hole 124a1 and the second through hole 124a2 pass through the rear cover 124 and extend to the receiving recess 124p, such that the first conductive portion 125 and the second conductive portion 126 may pass through the first through hole 124a1 and the second through hole 124a2 respectively to the receiving recess 124p, and inserted into the first conductive sheet 111 (as illustrated in FIG. 1) and the second conductive sheet 112 (as illustrated in FIG. 1).

As illustrated in FIG. 7, the rear cover 124 further includes an elastic sheet 1241 and a second engagement portion 1242, wherein the second engagement portion 1242 is disposed on an end of the elastic sheet 1241. When the mounting device 120 is hanged up on the mounting plate 110, the second engagement portion 1242 of the mounting device 120 is engaged with the first engagement portion 110a2 (as illustrated in FIG. 1) of the mounting plate 110, preventing the mounting device 120 from being detached from the mounting plate 110. In the present embodiment, as an example, the first engagement portion 110a2 is a recess, and the second engagement portion 1242 is a protrusion.

As illustrated in FIG. 7, the mounting device 120 further has a first rear surface 124r1, a second rear surface 124r2 and a bottom surface 124b. The receiving recess 124p is frontward extended to the second rear surface 124r2 from the first rear surface 124r1. The bottom surface 124b is downwardly and slantwise extended to the first rear surface 124r1 from the second rear surface 124r2. Through the design of the slant bottom surface 124b, during the mounting device 120 being detached from the mounting plate 110, the mounting device 120 may be easily detached from the mounting plate 110 by the inclined plane movement between the mounting device 120 and the bottom surface 124b.

As illustrated in an enlargement view of FIG. 7, the rear cover 124 further includes a first rib 1245 and a second rib 1243. The first rib 1245 is disposed opposite to the second rib 1243 to from a sliding channel 1244 therebetween. The first conductive portion 125 may pass through the first through hole 124a1 by being guided by the sliding channel 1244. After the first conductive portion 125 passes through the through hole 124a1, the movement of the first conductive portion 125 is restricted by the first rib 1245 and the second rib 1243.

While the disclosure has been described by way of example and in terms of the preferred embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A mounting plate, for being fixed to a surface, comprising:
   a first conductive sheet and a second conductive sheet electrically connected to a first electrode and a second electrode of an exterior power respectively;
   wherein when a mounting device is hanged up on the mounting plate, the exterior power is electrically connected to the mounting device through the first conductive sheet and the second conductive sheet;
   wherein the mounting plate further comprises:
   a plate body; and
   a plurality of hook pairs disposed on a rear surface of the plate body and hooked with two opposite sides of the first conductive sheet and the second conductive sheet;
   wherein the first conductive sheet has a through hole, and the plate body comprises:
   a fixing pillar comprising:
   a pillar body passing through the through hole of the first conductive sheet;
   a pressing head connecting to the pillar body and pressing against the first conductive sheet; and
   an island projected from the surface of the plate body; and
   a plurality of through holes passing through the island and the plate body, such that the first conductive sheet and the second conductive sheet may pass through the through holes from the rear surface of the plate body and be exposed from the island.

2. The mounting plate according to claim 1, further comprising:
   a protrusion projected from a front surface of the mounting plate and having a stop portion upwardly extended;
   wherein when the mounting device is hanged up on the protrusion of the mounting plate, the movement of the mounting device is restricted by the stop portion.

3. The mounting plate according to claim 1, wherein each of the first conductive sheet and the second conductive sheet comprises:
   a first elastic clamp; and
   a second elastic clamp disposed opposite to the first elastic clamp;
   wherein one end of the first elastic clamp is projected toward the second elastic clamp, and one end of the second elastic clamp is projected toward the first elastic clamp.

4. The mounting plate according to claim 1, further comprising a first engagement portion; when the mounting device is hanged up on the mounting plate, a second engagement portion of an elastic sheet of the mounting device is engaged with the first engagement portion.

5. A security device, comprising:
   the mounting plate according to claim 1; and
   the mounting device, for being hanged up on the mounting plate, comprising:
   a first conductive portion for contacting the first conductive sheet of the mounting device when the mounting device is hanged up on the mounting plate; and
   a second conductive portion for contacting the second conductive sheet of the mounting device when the mounting device is hanged up on the mounting plate.

6. The security device according to claim 5, wherein the mounting device comprises:
   a cover having a receiving recess, a first through hole and a second through hole, wherein the first through hole and the second through hole pass through the cover and extended to the receiving recess;
   wherein the first conductive portion and the second conductive portion are extended to the receiving recess through the first through hole and the second through hole respectively.

7. The security device according to claim 5, wherein the mounting plate comprises:
   a protrusion projected from a front surface of the mounting plate and having a stop portion upwardly extended;
   wherein the protrusion of the mounting plate passes through a through hole of the mounting device, and the movement of the mounting device is restricted by the stop portion.

8. The security device according to claim 5, wherein the mounting device has a receiving recess, a first rear surface, a second rear surface and a bottom surface, the receiving recess is frontward extended to the second rear surface from the first rear surface, and the bottom surface is downward and slantwise extended to the first rear surface from the second rear surface.

* * * * *